(12) United States Patent
Newlin

(10) Patent No.: US 6,181,203 B1
(45) Date of Patent: Jan. 30, 2001

(54) NON-LINEAR TRANSCONDUCTANCE AMPLIFIER

(75) Inventor: Trevor M. Newlin, San Jose, CA (US)

(73) Assignee: Semtech Corporation, Newbury Park, CA (US)

(*) Notice: Under 35 U.S.C. 154(b), the term of this patent shall be extended for 0 days.

(21) Appl. No.: 09/331,039

(22) PCT Filed: Jul. 28, 1998

(86) PCT No.: PCT/GB98/02143

§ 371 Date: Jun. 15, 1999

§ 102(e) Date: Jun. 15, 1999

(87) PCT Pub. No.: WO00/07295

PCT Pub. Date: Feb. 10, 2000

(51) Int. Cl.$^7$ .................................................. H03F 3/45
(52) U.S. Cl. .............................................. 330/257; 327/359
(58) Field of Search ................................. 330/252, 257, 330/261; 327/359

(56) References Cited

U.S. PATENT DOCUMENTS

| | | | |
|---|---|---|---|
| 4,987,380 | * 1/1991 | Ishikawa | 330/257 |
| 5,521,553 | * 5/1996 | Butler | 330/257 |
| 5,650,753 | * 7/1997 | Ling | 330/257 |
| 5,994,939 | * 11/1999 | Johnson et al. | 330/257 |

* cited by examiner

Primary Examiner—Benny Lee
Assistant Examiner—Khanh Van Nguyen
(74) Attorney, Agent, or Firm—D'Alessandro & Ritchie

(57) ABSTRACT

A nonlinear transconductance provides a nonlinear output in response to a differential signal input. In a switch-type closed loop system, such as switching mode DC—DC converter of phase lock loop, the nonlinear transconductance amplifier provides a very fast response time. The nonlinear transconductance amplifier is a linear transconductance amplifier that has been modified to include a nonlinear output stage of current mirrors having resistive elements connected to the emitters of the diode connected transistors in the current mirrors. The nonlinearity of nonlinear transconductance amplifier is exponential such that when the differential signal at the inputs to the nonlinear transconductance amplifier is less than a predetermined value, the nonlinear transconductance amplifier provides an output or error correction signal that is nonlinear according to a second relationship, and that when the differential signal at the inputs to the nonlinear transconductance amplifier is greater than a predetermined value, the nonlinear transconductance amplifier provides an output or error correction signal that is nonlinear according to a second relationship.

1 Claim, 2 Drawing Sheets

NON-LINEAR TRANSCONDUCTANCE AMPLIFIER

BACKGROUND OF THE INVENTION

1. Field of the Invention

The present invention relates to transconductance amplifiers. More particularly, the present invention relates to a nonlinear transconductance amplifier suitable to provide a nonlinear response to a differential signal. The nonlinear transconductance amplifier of the present invention is suitable for use as a nonlinear element in the feedback loop of a switching-type closed loop system, such as a DC—DC converter, for improving the response time to load transients, or a phase lock loop for improving the frequency capture rate. It may also be employed in a linear regulator.

2. The Prior Art

Traditional linear and more conventional switched mode power supply topologies are well known to those of ordinary skill in the art. In a typical linear power supply or voltage regulator circuit, a linear control element, such as a pass transistor, in series with an unregulated DC is used, with feedback, to maintain a constant output voltage. The output voltage is always lower in voltage than the unregulated input voltage, and some power is dissipated in the control element. Though the linear power supply has a fast response time, it is not very efficient in comparison to a switched mode converter when the input to output voltage ratio is large.

Typically, in a switching converter, a transistor operated as a saturated switch periodically applies the full unregulated voltage across an inductor for short intervals. The current in the inductor builds up during each pulse, storing ½ LI² of energy in its magnetic field. The stored energy is transferred to a filter capacitor at the output that also smooths the output by carrying the output load between the charging pulses. In order to accommodate rapid and transient load changes, and to filter the switch frequency from the output, the output capacitor preferably has a large value with a very low equivalent series resistance (ESR). With feedback, the output of the converter is compared with the input to control the switching frequency or pulse width of the signal applied to the transistor operated as a switch. Since the control element is either off or saturated, the power dissipation in the regulator is minimized. Accordingly, switching regulators are very efficient, even when there is a large voltage drop from the input to the output.

In FIG. 1, a known DC—DC converter 10, referred to by those of ordinary skill in the art as a step-down or "buck" topology, is illustrated. In converter 10, a switch 12 is controlled by the output a comparator 14 having an inverting input connected to an oscillatory signal and a non-inverting input connected to a feedback signal to be described to form a pulse width modulator (PWM). A first terminal of switch 12 is connected to Vin, and a second terminal of switch 12 is connected a first terminal of inductor 16 and the anode of diode 18. The second terminal of inductor 16 is connected to a first plate of load capacitor 20, and also through voltage divider pair 22-1 and 22-2 to the inverting input of error amplifier 24. Vout is formed at the second terminal of inductor 16. A second plate of load capacitor 20 is connected to the cathode of diode 18 to complete a loop for current circulation, and also to a ground reference potential. The non-inverting input of error amplifier 24 is connected to a reference potential 26. The output of error amplifier 24 is connected to a first end of a resistor 28. A second end of resistor 28 is connected to a first plate of capacitor 30 and to the non-inverting input of comparator 14 to complete a feedback loop from Vout. A second plate of capacitor 30 is connected to ground.

In the converter 10, a high input voltage at Vin is converted to a lower input voltage at Vout. When the switch 12 is closed by the output of comparator 14, the voltage Vout-Vin is applied across the inductor 16, causing a linearly increasing current to flow through the inductor 16. When the switch 12 is opened, inductor current continues to flow in the same direction with the diode 18 conducting to complete the circuit. Since the voltage across the inductor 16 is now the difference between Vout and the nominal diode 18 voltage, the inductor current will decrease linearly. The load capacitor 20 operates to minimize current and voltage ripple at the output of the converter 10. It will be appreciated that as the size of the capacitor 20 increases, the amount of ripple decreases, however, the response time of the converter 10 to changes in the load also increases.

The feedback loop including the error amplifier 24 forms a control circuit to ensure that Vout remains at a selected value with a high degree of precision. In the feedback loop, Vout through the voltage divider 22-1 and 22-2 is compared to the reference voltage 26. The difference between the reference voltage 26 and Vout determines the width of the pulse driving the switch 12 from comparator 14 in a manner well understood by those of ordinary skill in the art.

The feedback control of the converter 10 has a finite response time to changing load conditions. The value of the output capacitor 20 is typically chosen to provide continuity in Vout while the feedback loop is responding to the changing load condition. The response times are typically slow in comparison to linear regulators, due to the size of the output capacitor 20. Further, the output capacitor is typically expensive due to its size, and also quite bulky.

The error amplifier 24 is typically a conventional operational amplifier which employs feedback filtering to provide either phase lag or phase advance responses. The feedback filtering often includes an arrangement of several capacitors. To aid stability and simplify compensation requirements, the error amplifier 24 is often low gain. To improve the response time of the feedback loop, it is known to implement the error amplifier 24 as a linear transconductance amplifier with a capacitive load, though for an increasing number of applications, the response time is inadequate.

For example, in conventional computer systems, the load conditions of a microprocessor may change very small amounts in a very short time due to very high microprocessor speeds or may change significantly in a very short time due to a state change in the microprocessor, such as power up. Further, various input and output devices of the computer system, such as hard drives or CD ROMS may change the load conditions of the microprocessor very rapidly.

Accordingly, it is an object of the present invention to provide a DC—DC converter with a fast response time to load changes.

It is yet another object of the present invention to reduce the size of the output capacitor in a step down DC—DC converter topology.

It is further object of the present invention to reduce the size of a step down DC—DC converter by reducing the size of the output capacitor.

It is yet a further object of the present invention to provide a nonlinear transconductance amplifier with a nonlinear response to a differential input It another object of the present invention to simplify the phase compensation in an error amplifier of a DC—DC converter.

BRIEF DESCRIPTION OF THE INVENTION

According to the present invention, a nonlinear transconductance provides a nonlinear output in response to a differential signal input. In a switch-type closed loop system, the nonlinear transconductance amplifier provides a very fast response time. The nonlinear transconductance amplifier is a linear transconductance amplifier that has been modified to include a nonlinear output stage of current mirrors having resistive elements connected to the emitters of the diode connected transistors in the current mirrors. The nonlinearity of nonlinear transconductance amplifier is exponential such that when the differential signal at the inputs to the nonlinear transconductance amplifier is less than a predetermined value, the nonlinear transconductance amplifier provides an output or error correction signal that is nonlinear according to a first relationship, and when the differential signal at the inputs to the nonlinear transconductance amplifier is greater than a predetermined value, the nonlinear transconductance amplifier provides an output or error correction signal that is nonlinear according to a second relationship.

In a second aspect of the present invention, a phase compensation network is provided in the nonlinear transconductance amplifier.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 2:
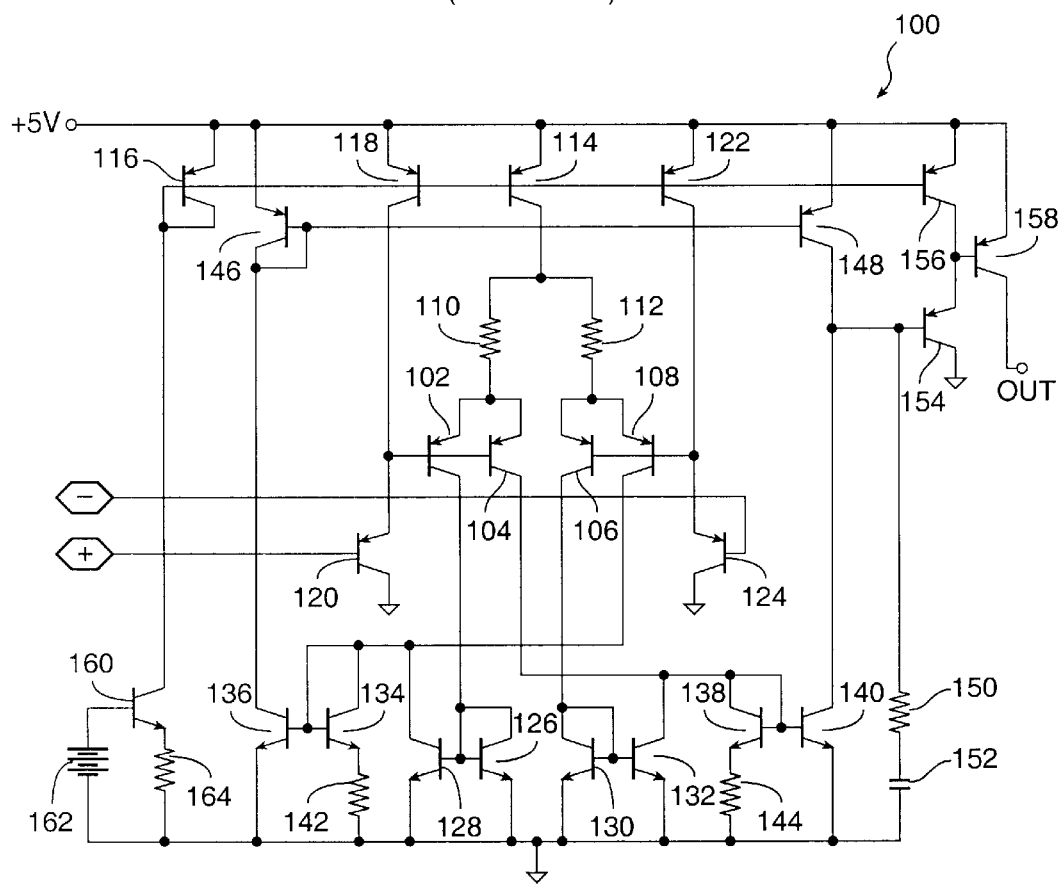
FIG. 2 is a schematic a nonlinear transconductance amplifier according to the present invention.

FIG. 2 illustrates a nonlinear transconductance amplifier 100. According to the present invention, the nonlinear transconductance amplifier 100 is a linear transconductance amplifier that has been modified to provide a nonlinear output stage. The nonlinearity of nonlinear transconductance amplifier 100 is exponential such that when the differential signal at the inputs to the nonlinear transconductance amplifier 100 is less than a predetermined value, the nonlinear transconductance amplifier 100 provides an output or error correction signal that is nonlinear according to a first relationship, and when the differential signal at the inputs to the nonlinear transconductance amplifier 100 is greater than a predetermined value, the nonlinear transconductance amplifier 100 provides an output or error correction signal that is nonlinear according to a second relationship.

Figure 3:
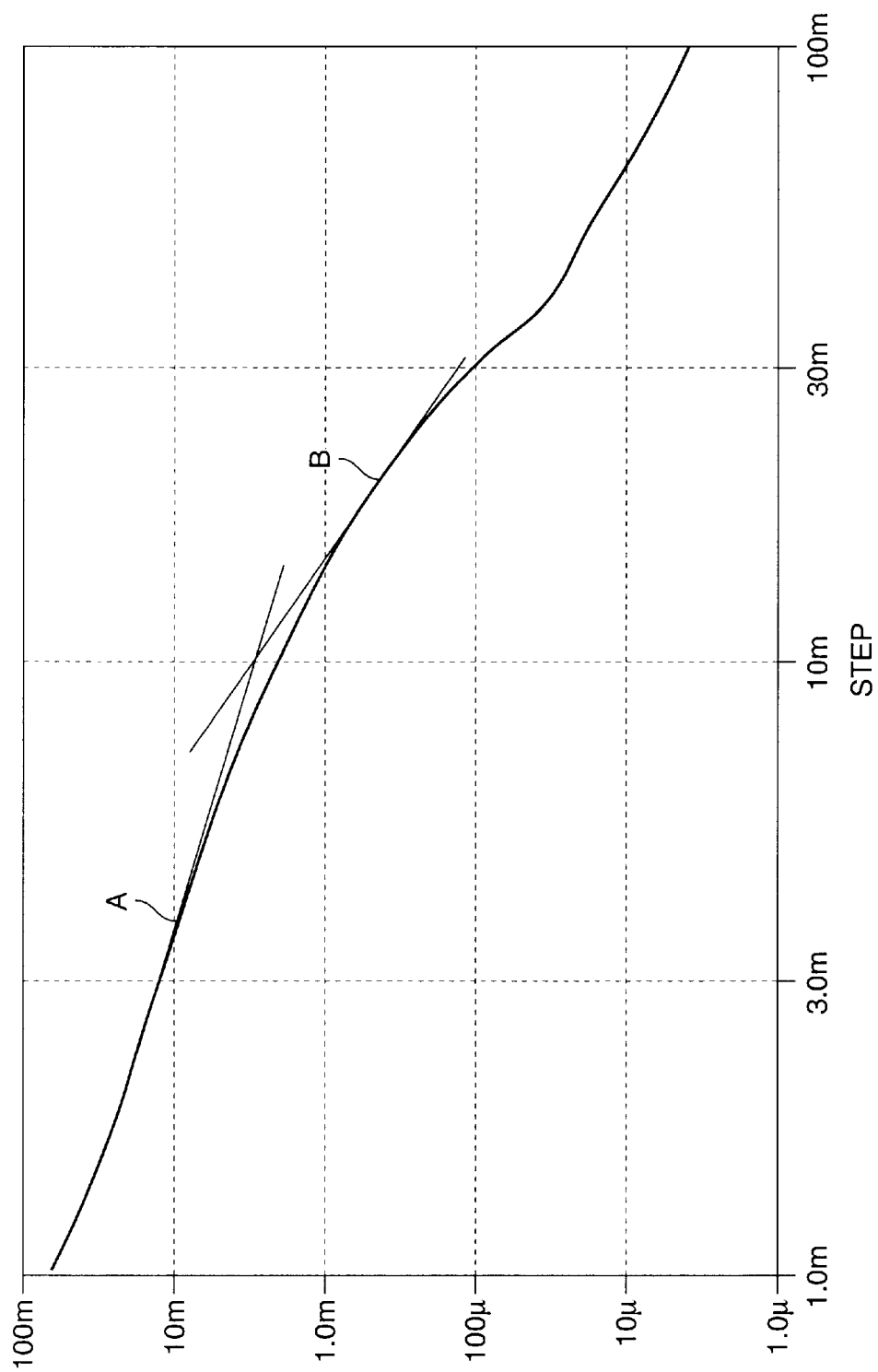
FIG. 3 is a graph of the response time of a DC—DC converter employing the nonlinear transconductance amplifier depicted in FIG. 2 to a differential signal according to the present invention.

In FIG. 3, the change in nonlinearity as the differential signal to the inputs of the nonlinear transconductance amplifier 100 changes is illustrated graphically. In FIG. 3, the horizontal axis represents the differential signal input, and the vertical axis represents the response time. Both the horizontal and vertical axes are log scale. It can be observed in part A of the curve, that as the differential signal changes from 1.0 mV to 10.0 mv that response time has a first nonlinear relationship, and in part B of the curve that as the differential signal changes from 10.0 mV to 100.0 mv that response time has a second nonlinear relationship. It will be appreciated by those of ordinary skill in the art, that because the scale is log—log, the first and second relationships both appear to be linear.

Figure 1:
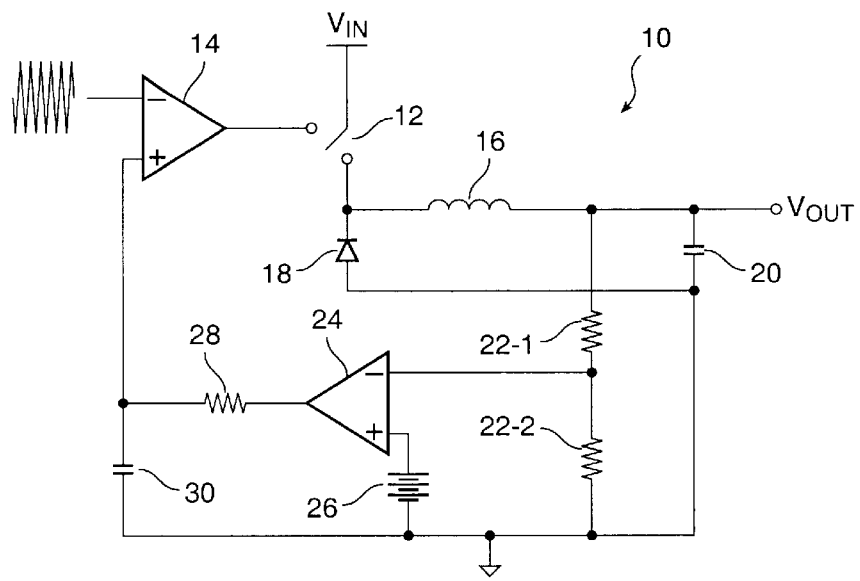
FIG. 1 is a schematic diagram of a DC—DC step down converter according to the prior art.

The nonlinear transconductance amplifier 100 is suitable for use as the error amplifier 24 depicted in FIG. 1. Those of ordinary skill in the art should also appreciate from the disclosure herein that the nonlinear transconductance amplifier 100 may be employed in phase locked loops and other switching-type closed loop systems. For example, in a phase locked loop, the nonlinear transconductance amplifier 100 could be employed to improve the rate of the frequency capture. The nonlinear transconductance amplifier 100 is also suitable for use in a linear converter.

Turning again to FIG. 2, in nonlinear transconductance amplifier 100, PNP bipolar transistors 102, 104, 106 and 108 form a dual differential pair with PNP bipolar transistors 102 and 104 in a first pair, and PNP bipolar transistors 106 and 108 in a second pair. The emitters of PNP bipolar transistors 102 and 104 are connected to a first end of resistor 110, and the emitters of PNP bipolar transistors 106 and 108 are connected to a first end of resistor 112. A second end of resistors 110 and 112 are connected to the collector of PNP bipolar transistor 114. The resistors 110 and 112 connected to the emitters of PNP bipolar transistors 102, 104, 106 and 108 provide degeneration to reduce the loop gain of the nonlinear transconductance amplifier 100. The emitter of PNP bipolar transistor 114 is connected to the 5V power rail, and the base of PNP bipolar transistor 114 is connected to the base of the diode connected PNP bipolar current mirror transistor 116 The emitter of the PNP bipolar current mirror transistor 116 is connected to the 5V power rail. The PNP bipolar transistor 114 provides current biasing to the dual differential pair.

The bases of first differential PNP bipolar transistor pair 102 and 104 are connected to an input level shifting circuit comprising PNP bipolar transistors 118 and 120. The bases of PNP bipolar transistors 102 and 104 are connected to the common node formed by the collector of PNP bipolar transistor 118 and the emitter of PNP bipolar transistor 120. The emitter of PNP bipolar transistor 118 is connected to the 5V power rail, and the collector of PNP bipolar transistor 120 is connected to ground. The base of PNP bipolar transistor 118 is connected to the base of the diode connected PNP current mirror transistor 116, and the base of the PNP bipolar transistor 120 is connected to the noninverting input of the nonlinear transconductance amplifier 100. In the level shifting circuit comprising PNP bipolar transistors 118 and 120, the PNP bipolar transistor 118 provides pull-up current for the PNP bipolar transistor 120, and the PNP bipolar transistor 120 provides input level shift which permits the non-inverting input to sense to ground.

The second differential pair of PNP bipolar transistors 106 and 108 have their bases connected to an input level shifting circuit comprising PNP bipolar transistors 122 and 124. The bases of the second differential pair of PNP bipolar transistors 106 and 108 are connected to the common node formed by the collector of PNP bipolar transistor 122 and the emitter of PNP bipolar transistor 124. The emitter of PNP bipolar transistor 122 is connected to the 5V power rail and the collector PNP bipolar transistor 124 is connected to ground. The base of PNP bipolar transistor 122 is connected to the base of the PNP bipolar current mirror transistor 116, and the base of PNP bipolar transistor 124 is connected to the inverting input of nonlinear transconductance amplifier 100.

In the level shifting circuit comprising PNP bipolar transistors 122 and 124, the PNP bipolar transistor 122 provides pull-up current for the PNP bipolar transistor 124, and the PNP bipolar transistor 124 provides input level shift which permits the non-inverting input to sense to ground.

Current mirrors are formed by the pairs of NPN bipolar transistors 126 and 128, 130 and 132, 134 and 136, and 138 and 140. The current pairs of NPN bipolar transistors 126 and 128, and 130 and 132 are included in the first stage of nonlinear transconductance amplifier 100, and the current pairs of NPN bipolar transistors 134 and 136, and 138 and 140 are included in the second stage of nonlinear transconductance amplifier 100.

In the first current mirror pair comprising NPN bipolar transistors 126 and 128, the collector of PNP bipolar transistor 102 is connected to the collector and emitter of NPN bipolar transistor 126 and to the base of NPN bipolar transistor 128, and the collector of PNP bipolar transistor 108 is connected to the collector of NPN bipolar transistor 128. The emitters of NPN bipolar transistors 126 and 128 are connected to ground.

In the second current mirror pair comprising NPN bipolar transistors 130 and 132, the collector of PNP bipolar transistor 106 is connected to the collector and emitter of NPN bipolar transistor 130 and to the base of NPN bipolar transistor 132, and the collector of PNP bipolar transistor 104 is connected to the collector of NPN bipolar transistor 128. The emitters of NPN bipolar transistors 130 and 132 are connected to ground.

In the third current mirror pair comprising NPN bipolar transistors 134 and 136, the collector of PNP bipolar transistor 108 is connected to the collector and emitter of NPN bipolar transistor 134 and to the base of NPN bipolar transistor 136. The emitter of NPN bipolar transistors 134 is connected to the first end of resistor 142 and the second end of resistor 142 is connected to ground. The collector of NPN bipolar transistor 136 is connected to the collector of PNP bipolar diode connected transistor 146.

In the fourth current mirror pair comprising NPN bipolar transistors 138 and 140, the collector of PNP bipolar transistor 104 is connected to the collector and emitter of NPN bipolar transistor 138 and to the base of NPN bipolar transistor 140. The emitter of NPN bipolar transistors 138 is connected to the first end of resistor 144 and the second end of resistor 144 is connected to ground. The collector of NPN bipolar transistor 140 is connected to the collector of PNP bipolar diode connected transistor 148.

The PNP bipolar transistors 146 and 148 comprise a current mirror pair. The emitters of PNP bipolar transistors 146 and 148 are connected to the 5V power supply rail. The common collector connection between NPN bipolar transistor 140 and PNP bipolar transistor 148 forms the output of the nonlinear transconductance amplifier 100 prior to phase compensation and buffering. The output formed at the common collector connection is connected to a phase compensation network comprising resistor 150 and capacitor 152, and an output buffer network formed by PNP bipolar transistors 154, 156 and 158.

In the compensation network, a first end of resistor 150 is connected to the common collector connection, and a second end of resistor 150 is connected to a first plate of capacitor 152. A second plate of capacitor 152 is connected to ground. In the output buffer network, the common collector connection is connected to the base of PNP bipolar transistor 154. The emitter of PNP bipolar transistor 154 is connected to the collector of PNP bipolar transistor 156 and to the base of PNP bipolar transistor 158, and the emitters of PNP bipolar transistors 156 and 158 are connected to the 5V power supply rail, and the base of PNP bipolar transistor 156 is connected to the PNP bias transistor 116. The collector of PNP bipolar transistor 158 forms the output of the nonlinear transconductance amplifier 100.

Base drive for each of the PNP bipolar transistors 114, 116, 118, 122 and 156 is provided bias current network comprising NPN bipolar transistor 160, reference potential 162, and resistor 164. In the bias current network, the base of NPN bipolar transistor 160 is connected to the reference potential 162, and the collector of NPN bipolar transistor 160 is connected to the bases of PNP bipolar transistors 114, 116, 118, 122 and 156. The emitter of NPN bipolar transistor 160 is connected to a first end of resistor 164, and a second end of resistor 164 is connected to ground.

According to the present invention, the nonlinear transconductance amplifier 100 operates as two stage transconductance amplifier having a non-linear second stage. The first stage is formed by the dual differential pair comprising PNP bipolar transistors 102, 104, 106 and 108, and NPN bipolar transistor current mirror pairs 126, and 128, and 130 and 132. The gain of the first stage is set by the bias current and the resistors 110 and 112 in a manner well understood by those of ordinary skill in the art. The second nonlinear stage is formed by the NPN bipolar current mirror transistor pairs 134 and 136, and 138 and 140.

In the second stage, the resistors 142 and 144 found in the emitter circuits of the diode connected NPN transistors 134 and 138 create a gain in the amplifier that is exponential. As the differential signal passes the breakpoint, the nonlinear gain becomes quite large to provide a very fast response time. The output of the current mirror formed by NPN bipolar current mirror transistor pair 134 and 136 is mirrored round by PNP bipolar transistors 146 and 148 and summed with the current of NPN bipolar transistor 140.

According to the present invention, the emitter resistors 142 and 144 provide an exponential current output for large input signals, but at low levels the current output remains essential linear. The resistor values of resistors 142 and 144 are determined along with the degeneration resistance provided by resistors 110 and 112 to set the knee point for the exponential current change on the output. The exact knee is one of design choice, but will typically be determined by the ripple and the output smoothing network provided by the capacitor 20 as depicted in the DC—DC converter 10 of FIG. 1.

In the phase compensation network comprising resistor 150 and capacitor 152, the phase of the output signal being feedback is shifted. In comparison to the implementation of phase shifting in a conventional op-amp employed as an error amplifier, the phase compensation of the present invention is very simply implemented. The resistor 150 is included in the phase compensation network to reduce the amount of compensation required at high frequencies.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A nonlinear transconductance amplifier comprising:
   a first stage including;
      a dual differential pair of bipolar transistors;
      means for biasing said dual differential pair of bipolar transistors;
      first and second inputs coupled to said dual differential pair of bipolar transistors; and
      first and second bipolar transistor current mirrors coupled to said dual differential pair of bipolar transistors;
   a second stage including:
      third and fourth bipolar transistor current mirrors coupled to said dual differential pair of bipolar transistors, said third and fourth bipolar transistor current mirrors each having a resistive element coupled to a diode connected transistor in said third and fourth bipolar transistor current mirrors; and
   means for providing an output from said second stage.

* * * * *

UNITED STATES PATENT AND TRADEMARK OFFICE
CERTIFICATE OF CORRECTION

PATENT NO.    : 6,181,203 B1                                Page 1 of 1
DATED         : January 30, 2001
INVENTOR(S)   : Trevor M. Newlin It is certified that error appears in the above-identified patent and that said Letters Patent is hereby corrected as shown below:

Column 1,
Line 54, after "connected" insert -- to --.

Column 2,
Line 58, after "is" insert -- a --.
Line 64, after "It" insert -- is --.

Column 4,
Line 33, after "116" insert -- . --.

Column 6,
Line 44, replace "essential" with -- essentially --.

Signed and Sealed this

Twenty-sixth Day of February, 2002

Attest:

Attesting Officer

JAMES E. ROGAN
Director of the United States Patent and Trademark Office